United States Patent [19]
Ueda et al.

[11] Patent Number: 5,508,232
[45] Date of Patent: Apr. 16, 1996

[54] METHOD OF MANUFACTURING A SEMICONDUCTOR DEVICE

[75] Inventors: Tetsuya Ueda; Kazunari Michii; Yutaka Koyama; Naoto Ueda, all of Kikuchi, Japan

[73] Assignee: Mitsubishi Denki Kabushiki Kaisha, Tokyo, Japan

[21] Appl. No.: 386,808

[22] Filed: Feb. 6, 1995

[30] Foreign Application Priority Data

Feb. 7, 1994 [JP] Japan ................... 6-013751

[51] Int. Cl.$^6$ ................... H01L 21/60
[52] U.S. Cl. ................... 437/211; 437/209; 437/214; 437/217; 437/220
[58] Field of Search ................... 437/209, 211, 437/214, 215, 216, 217, 218, 214, 220

[56] References Cited

U.S. PATENT DOCUMENTS

| | | | |
|---|---|---|---|
| 4,445,271 | 5/1981 | Grabbe | 437/220 |
| 5,096,853 | 3/1992 | Yasunago et al. | 437/211 |
| 5,202,288 | 4/1993 | Doering et al. | 437/220 |
| 5,214,846 | 6/1993 | Asami et al. | 437/211 |
| 5,278,101 | 1/1994 | Ikenoue | 437/220 |
| 5,327,008 | 7/1994 | Djennas et al. | 437/220 |
| 5,334,872 | 8/1994 | Ueda et al. | 257/675 |
| 5,352,632 | 10/1994 | Sawaya | 437/211 |
| 5,378,656 | 1/1995 | Kajihara et al. | 437/211 |

FOREIGN PATENT DOCUMENTS

| | | |
|---|---|---|
| 60-113932 | 6/1985 | Japan . |
| 1201947 | 8/1989 | Japan . |
| 2253650 | 10/1990 | Japan . |
| 4192450 | 7/1992 | Japan . |
| 4249348 | 9/1992 | Japan . |
| 4258142 | 9/1992 | Japan . |

Primary Examiner—Tom Thomas
Assistant Examiner—Kevin M. Picardat
Attorney, Agent, or Firm—Leydig, Voit & Mayer

[57] ABSTRACT

In a method of manufacturing a semiconductor device, overlaid on a first lead frame including a die pad supported by a plurality of die pad suspending leads is a second lead frame having connecting leads wherein the first and second lead frames are disposed on a first molding die such that the die pad and inner lead portions of the inner leads of the second lead frame are accommodated within a first cavity of the first molding die while offset portions of the die pad suspending leads are disposed outside of the first cavity. A second molding die is clamped onto the first molding die to define a resin molding chamber which is then filled with a molten resin to form a package. After removing the package from the first and second molding dies, the offset portions are cut away from the package while cutting the connecting leads to a predetermined length. A semiconductor chip as large as permissible can be embedded within a semiconductor device of a standard size while ensuring high quality and improved reliability of the semiconductor device.

16 Claims, 12 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device. Note specifically, the present invention is concerned with a semiconductor manufacturing method which allows a semiconductor chid of a given large size to be embedded within a packaged semiconductor device of standardized size while ensuring a high quality an reliability of the semiconductor device as well as high yield thereof.

2. Description of Related Art

A semiconductor device implemented in a package structure such as shown in FIG. 16 is known and widely used. For better understanding of the invention, technical background thereof will be described in some detail.

Referring to FIG. 6, a semiconductor device 100 known heretofore includes a die pad 101 having die pad suspending leads 102. Mounted on the die pad 101 is a semiconductor chip 110 having electrodes 111 which are electrically connected to a plurality of connecting leads 103 disposed along and around an outer periphery of the die pad 101 by bonding with metal wires 112 such as gold wires, aluminum wires or the like. The semiconductor electric circuit chip realized in this manner is hermetically embedded as a whole within a package 120 of an insulating material such as a resin with outer end portions (i.e., outer lead potions) of the connecting leads 103 being exposed outwardly from the insulating material.

For manufacturing the semiconductor device 100 of the structure described above, a sheet-like lead frame composed of the clue pad 101, the die pad suspending leads and the connecting leads 103 formed integrally with one another is prepared. After forming electrical connections between the semiconductor chip 110 mounted on the die pad and the connecting leads 103 by bonding the metal wires at both ends thereof, respectively, the sheet-like lead frame is disposed within a molding die with die pad suspending leads 102 projecting, respectively, from both opposite sides of the die pad 101 supported between abutting surfaces of molding dies superposed on each other. In this state, the molding chamber defined by the dies is filled with a molten resin material for forming the package 120. After hardening of the resin, the package 120 is removed from the metal mold and those portions of the die pad suspending leads 102 which project from the outer peripheral surface of the packages 120 are cut away with the connecting leads 103 being cut to a predetermined length.

By the way, the sheet-like lead frame and the inner end portions (inner leads) of the connecting leads 103 are disposed flush with the die pad 101 i.e., in the same plane. Consequently, the connecting leads 103 assume considerably lower positions relative to the top surface of the semiconductor chip 110. As a result of this, when the metal wires 112 are connected to the connecting leads 103, there may arise such an unwanted situation in which the metal wire 112 is brought into physical contact with the semiconductor chip 110 to thereby form a short-circuit, as is illustrated in FIG. 18 within a solid outline circle.

In the semiconductor device 100 known heretofore, the problem mentioned above is coped with by applying a stamping force on the die pad 101 and a base portion of the die pad suspending leads 102 connected to the die pad 101 upon manufacturing of the lead frame, as shown in FIG. 17, so that the connecting leads 103 are lifted to positions close to the top surface of the semiconductor chip 110 to thereby prevent the metal wires 112 from contacting the semiconductor chip 110, as indicated by phantom lines in FIG. 18.

Thus, in the semiconductor device 100 as manufactured, the base portion of each of the die pad suspending leads 102 has a downwardly bent portion (hereinafter referred to as the offset portion) as shown in FIG. 17. The die pad 101 connected integrally to the die pad suspending leads 102 is positioned at a lower level relative to the connecting leads 103, wherein the bent or offset portions 102a are completely encapsulated or embedded within the package 120 having a large thickness.

The hitherto known semiconductor device 100 of the structure in which the offset portions 102a are completely encapsulated within the package 120 however suffers from a problem that difficulty is encountered in attempting to increase the size of the semiconductor chip 110 incorporated in the semiconductor device 100 having predetermined standardized outer dimensions because of the obstacle presented by the offset portion 102a.

More specifically, since the design length of the offset portion 102a needs to be selected relatively large, on the order of 0.1 mm to 0.7 mm, the thickness of the resin package 120 will increase beyond a limit required for preventing occurrence of cracks, invasion of moisture and others. As a result of this, in the semiconductor device 100 having a standardized outer dimension L1, limitation will necessarily be imposed on the size L2 of the semiconductor chip 110 which can be encapsulated within the package 120, making it impossible to incorporate the semiconductor chip 110 of a large size in the semiconductor device.

Such being the circumstances, the conventional manufacturing method described above cannot be applied to the manufacture of the semiconductor device destined for use as a memory device, among others. The devices are required to incorporate semiconductor chips of large size in order to meet a demand for miniaturization and high density integration of the semiconductor device which has become very prominent in recent years accompanying a trend of downsizing of computers or the like systems in which the semiconductor devices find applications.

In conjunction with the semiconductor device 100 known heretofore, it must further be pointed out that because the offset portion 102a is formed by applying a stamping force to the offset portion 102a by resorting to a press forming process or the like in order to lower the position of the die pad 101, the offset portion 102a will mechanically be stretched or elongated, which results in degradation in the mechanical strength of the offset portion.

As a consequence, when the molten resin is poured or injected into the molding die in the state in which the die pad 101 is supported on the metal mold by the die pad suspending leads 102 extending laterally from the die pad 101 in opposite directions, respectively, the offset portions 102a are likely to be displaced upwardly or downwardly or twisted and thus deviated from the predetermined position, these deviations give rise to a problem that not only the quality but also the reliability of the semiconductor device 100 are degraded. Of course, the yield of the finished product is lowered.

For coping with the problems mentioned above, it is conceivable to provide the die pad 101 or the lead frame 106 having the connecting leads 103 connected thereto with the die pad suspending leads 102 in pairs. To be more specific, a pair of die pad suspending leads 102 are provided at each of opposite sides of the die pad 101 to thereby compensate for degradation in the mechanical strength brought about by the stamping force.

However, when the lead frame 106 is implemented in the structure described just above, it will then become difficult or impossible to position the inner lead 103-1 within the area enclosed by the two die pad suspending leads 102 (hatched area G in FIG. 19).

Further, with the structure described above, a distance K between the inner lead 103-1 and the electrode 111 of the semiconductor chip 110 will increase, involving difficulty in interconnecting the inner lead 103-1 and the semiconductor chip 110 by the metal wires 112 whose length is previously standardized.

SUMMARY OF THE INVENTION

In the light of the state of the art described above, it is an object of the present invention to provide a semiconductor device manufacturing method which makes it possible to accommodate within a semiconductor device standardized in respect to the outer dimensions (size) a semiconductor chip of as large a size as permissible, while ensuring high quality and improved reliability of the semiconductor device as well as a high yield of the finished product.

In view of the above and other objects which will become more apparent as description proceeds, there is provided according to a first aspect of the present invention a method of manufacturing a semiconductor device, which method includes a first step of disposing in superposition to a first lead frame supporting a die pad having a semiconductor chip mounted thereon through a plurality of die pad suspending leads, each supporting lead having an offset portion, a second lead frame having connecting leads extending to positions close to electrodes in the semiconductor chip and connecting electrically inner lead portions of the connecting leads to the electrodes of the semiconductor chip by metal wires, respectively, a second step of positioning the first and second lead frames on a first molding die such that the die pad and the inner lead portions are disposed within a first cavity formed in the first molding die while the offset portions of the die pad suspending leads are disposed outside of the first cavity, and overlying a second molding die having a second cavity formed therein on the first molding die to thereby define a resin molding chamber, the first and second lead frames inclusive of the offset portions being held between abutting surfaces of the first and second molding dies, a third step of forming a package by filling the resin molding chamber with a resin, and a fourth step of removing the package from the first and second molding dies and cutting off the offset portions exposed exteriorly from the package while cutting the connecting leads to a predetermined length.

With the arrangement that the offset portions of the die pad suspending leads which are weakened in strength are disposed outside of the molding chamber when the die pad is supported within the molding cavity by the die pad suspending leads which are held fixedly between the abutting surfaces of the first and second molding dies as described above, the die pad suspending leads located within the resin molding chamber have no portions locally weakened. Thus, unwanted displacements of the die pad such as relocation, rotation, twisting and the like which may otherwise occur when the resin molding chamber is filled with a molten resin can effectively be suppressed. Further, by supporting the die pad with plural die pad suspending leads, the displacements of the die pad can be prevented more positively, whereby a semiconductor device of high quality and reliability can be manufactured with high yield. Besides, because the offset portions of the die pad suspending leads are not embedded within the package, the thickness thereof can be reduced, as a result of which a semiconductor chip of a larger size as compared with that of the device known heretofore can be accommodated within the package which is standardized in respect to the outer dimensions. Thus, the inner lead portion of the connecting lead can be inserted to a position close to the semiconductor chip beyond the offset portions, and the distance between the inner lead portion and the electrode of the semiconductor chip is shortened, whereby the metal wire used for electrically connecting the inner lead portion to the electrode can be realized within a standardized range of lengths, to further advantage.

Further provided according to a second aspect of the present invention is a method of manufacturing a semiconductor device, which method includes a first step of forming a lead frame including a die pad, die pad suspending leads connected to the die pad and each having an offset portion and connecting leads extending to positions close to the die pad, mounting a semiconductor chip on the die pad and connecting electrically inner lead portions of the connecting leads to electrodes of the semiconductor chip by metal wires, a second step of positioning the lead frame on a first molding die such that the die pad and the inner lead portions of the connecting leads are disposed within a first cavity formed in the first molding die while the offset portions of the die pad suspending leads are disposed outside of the first cavity, and overlaying a second molding die having a second cavity formed therein on the first molding die to thereby define a resin molding chamber with the lead frame inclusive of the offset portions being held between abutting surfaces of the first and second molding dies, a third step of forming a package by filling the resin molding chamber with a resin, and a fourth step of removing the package from the first and second molding dies and cutting away the offset portions exposed outside of the package while cutting the connecting leads to a predetermined length.

With the arrangement that the offset portions of the die pad suspending leads which are reduced in strength are disposed outside of the molding chamber when the die pad is supported within the molding cavity by the die pad suspending leads which are held fixedly between the abutting surfaces of the first and second molding dies, as described above, the die pad suspending leads located within the resin molding chamber have no portions locally weakened. Thus, even when a non-uniform pressure is applied to the die pad upon filling the molding chamber with the resin, the die pad can be protected against unwanted linear and angular displacements by the die pad suspending leads, whereby the quality and reliability of the finished semiconductor device can be significantly improved while assuring a high yield. Besides, since the offset portions of the die pad suspending leads are not embedded within the package, the thickness the package can be reduced, which in turn means that a semiconductor chip of a greater size as compared with that of the device known heretofore can be accommodated within the package standardized in respect to the outer dimensions. Thus, miniaturization and high integration density can be promoted. In other words, the semiconductor device manufacturing method according to the present invention can profitably find application to the manufacture of a semiconductor device incorporating a large scale semiconductor device such as destined for a semiconductor memory.

In a preferred mode for carrying out the invention, the first step may include substeps of stamping or pressing down the die pad suspending leads to thereby form the offset portions, mounting the semiconductor chip on the die pad, and forming electrical connections between the electrodes of the semiconductor chip and the inner lead portions of the connecting leads by bonding the metal wires.

By performing the stamping or press-down process on the die pad suspending leads, the offset portions can easily be formed. Even when the die pad suspending leads and the connecting leads are formed integrally with the single lead frame, the offsets (i.e., difference in level or height) between the electrodes of the die pad and the connecting leads can be decreased to thereby prevent effectively the metal wires from contacting the semiconductor chip.

In another preferred mode for carrying out the first step of the semiconductor manufacturing methods according to the invention, the lead frame may be formed with a plurality of first projecting pieces each constituting a part of the die pad suspending lead and the connecting leads and each extending transversely to a tip end of the first projecting piece in front thereof. A plurality of second projecting pieces extending horizontally from the die pad are also formed and, after disposing the die pad such that each of the second projecting pieces extends beneath each of the connecting leads extending transversely, a tip end portion of the first projecting piece to be positioned beneath the first projecting piece, the first and second projecting pieces are mutually connected by connecting members, respectively, to thereby form the plurality of die pad suspending leads.

By connecting the first and second projecting pieces by the connecting member, the offset portion can easily be formed. Even when the die pad suspending leads and the connecting leads are formed integrally with the single lead frame, the offsets between the electrodes of the die pad and the connecting leads can be decreased, whereby the metal wires can positively be prevented from contacting the semiconductor chip.

In yet another preferred mode for carrying out the invention, the connecting member may be formed of an adhesive material.

By using the adhesive material as the connecting member, the offset portion can be formed extremely easily by simply connecting together the first and second projecting pieces with the adhesive interposed therebetween.

In still another preferred mode for carrying out the invention, the connecting member may include a spacer disposed below the first projecting piece and the connecting lead extending transversely to a tip end of the first projecting piece in front thereof and bonded to both of the first projecting piece and the second projecting piece sandwiched between the first and second projecting pieces.

The spacer used as the connecting member as described above is very effective for positively preventing the connecting lead extending transversely in front of the free end of the first projecting piece from contacting the second projecting piece of the connecting lead, to thereby exclude a short-circuit fault.

In a further preferred mode for carrying out the invention, the connecting member may include a projection formed in one of the first and second projecting pieces and bonded to the other of the first and second projecting pieces.

By virtue of the realization of the connecting member as mentioned above, the offset magnitude (difference in height or level) of the die pad can selectively be determined by adjusting the height of the projection, which is advantageous for preventing the connecting lead from contacting the second projecting piece.

In a yet further preferred mode for carrying out the invention, electric connections between the electrodes of the semiconductor chip and the connecting leads may be formed by bonding the metal wires with tip end portions of the connecting leads extending between the die pad suspending leads supported on supporting platforms protruding upwardly between and beyond adjacent die pad suspending leads.

With the arrangement described above, the bonding of the metal wires to the connecting leads can be performed with the tip end portions of the connecting leads being positively supported on the supporting platform.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE PREFERRED EMBODIMENTS

Figure 1:
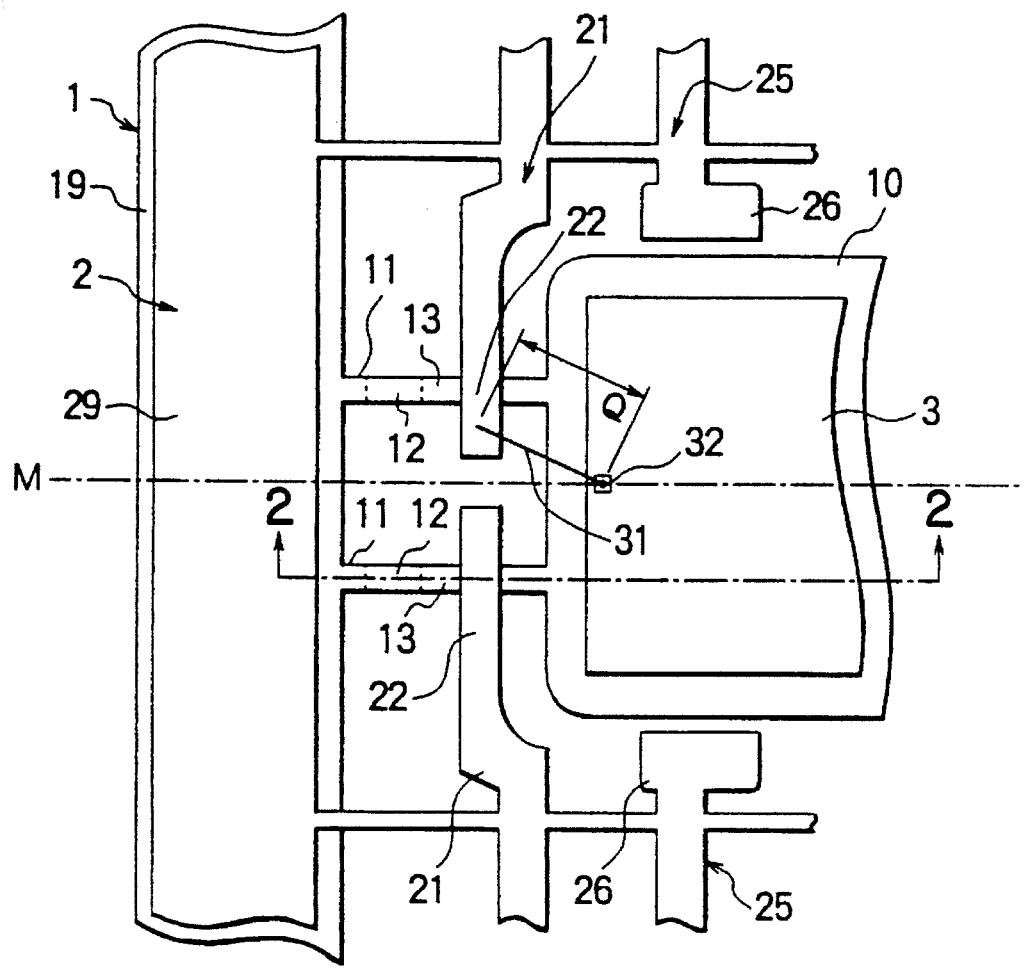
FIG. 1 is a top plan view for illustrating a die pad stamping/wire bonding process in a semiconductor device manufacturing method according to a first embodiment of the present invention.

Now, the present invention will be described in detail in conjunction with preferred or exemplary embodiments thereof by reference to the drawings. In the following description, like reference characters designate like or corresponding parts throughout the several views. Also in the following description, it is to be understood that such terms as "left", "right", "top", "bottom", "upwardly", "downwardly" and the like are words of convenience and are not to be construed as limiting terms.

Embodiment 1

FIGS. 1 to 11 show a semiconductor device manufacturing method according to a first exemplary embodiment of the present invention, which method is generally comprised of a die pad stamping (press-down) and wire bonding process as a first step, a frame positioning step as a second step, a forming step as a third step and a lead cutting step as a fourth step.

In the beginning, description will be made of the die pad stamping/wire bonding process as the first step.

Figure 2:
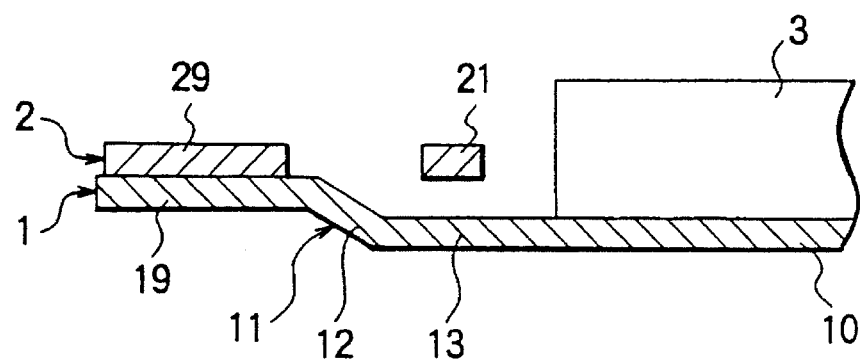
FIG. 2 is a sectional view taken along a line 2—2 in FIG. 1 and viewed in the direction indicated by affixed arrows.
Figure 3:
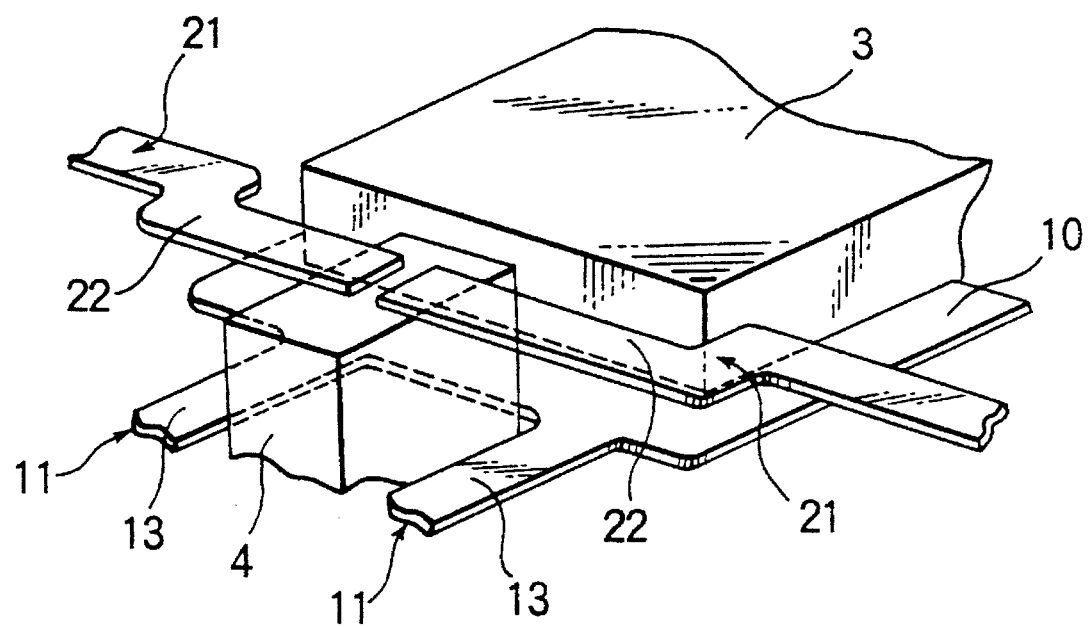
FIG. 3 is a perspective view showing a supporting platform used in a wire bonding process.

FIG. 1 is a top plan view for illustrating the die pad stamping/wire bonding process according to the first embodiment of the invention, FIG. 2 is a sectional view taken along a line 2—2 in FIG. 1, and FIG. 3 is a perspective view showing a supporting platform used in a wire bonding process.

Referring to FIG. 1, a reference numeral 1 generally denotes a first lead frame which includes a die pad 10. More specifically, the first lead frame 1 is provided with the die pad 10 which is disposed centrally and has a plurality of die pad suspending leads 11 formed integrally with the die pad 10 and extending laterally from opposite sides (of which only the left side is shown in FIG. 1) of the die pad 10, wherein the die pad 10 is connected to a frame member 19 by means of the die pad suspending leads 11. According to the teachings of the invention, the die pad 10 of the first lead frame 1 undergoes a press-down or stamping process which will be described below.

Referring to FIG. 2, the die pad 10 is stamped or pressed downwardly together with the die pad suspending leads 11 by resorting to press forming or the like to thereby form an offset portion 12 extending downwardly from the frame member 19 toward the die pad 10 with an inclination relative thereto and a horizontal portion 13 extending from the offset portion 12 to the die pad 10 in each of the die pad suspending leads 11. A semiconductor chip 3 is mounted on the die pad 10 of the first lead frame 1 formed in this way.

Turning to FIG. 1, further provided is a second lead frame 2 which has a plurality of first connecting leads 25 and a plurality of second connecting leads 21 which are longer than the first connecting leads 25. More specifically, the second connecting leads 21 are disposed in pairs at opposite sides (shorter sides), respectively, of the die pad 10 having a rectangular shape, wherein a tip end portion or inner lead portion 22 of each of the second connecting leads 21 extends above and across the horizontal portion 13 of the associated one of the die pad suspending leads 11.

Disposed between the second connecting leads 21 located at one side (a long side) of the die pad 10 are a plurality of the first connecting leads 25 mentioned above, wherein the second connecting leads 21 and the first connecting leads 25 are connected to a frame portion 29 to constitute the second lead frame 2.

The second connecting leads 21 of the second lead frame 2 are electrically connected to electrodes of the semiconductor chip 3 by bonding metal wires 31 such as wires of gold, aluminum or the like in a manner described below.

The first lead frame 1 and the second lead frame 2 are superposed onto each other with the frame member 19 and the frame member 29 being positioned coaxially, and a wire bonding jig (not shown) is set to a bonding position, as shown in FIG. 1. In this state, the die pad 10 of the first lead frame 1 as well as the horizontal portions 13 of the die pad suspending leads 11 assume a position offset downwardly relative to the plane of the second lead frame 2, as shown in FIG. 2. Thus, the inner lead portion 22 of each of the second connecting leads 21 of the second lead frame 2 can extend inwardly beyond and above the horizontal portion 13 of the die pad suspending lead 11 to a position located closely to the center or longitudinal axis M of the semiconductor chip 3 without making contact with the horizontal portion 13, as can be seen from FIGS. 1 and 2.

Subsequently, the supporting platform 4 of the wire bonding jig mentioned above is so positioned as to project upwardly through a gap defined between a pair of the die pad suspending leads 11 until the top surface of the supporting platform 4 abuts against the bottom surfaces of the inner lead portions 22 of the second connecting leads 21, as shown in FIG. 3. In this state, both end portions of the metal wire 31 can be bonded to the inner lead portion 22 of the second connecting lead 21 and the electrode 32 on the top surface of the semiconductor chip 3, respectively. In that case, because the tip end portions 22 of the second connecting leads 21 are fixedly supported on the top surface of the supporting platform 4, one end of each metal wire 31 can easily and positively be bonded to the inner lead portion 22 of the second connecting leads 21.

Further, because the second connecting lead 21 is disposed above the horizontal portions 13 of the die pad suspending leads 11 in the vicinity of the top surface of the semiconductor chip 3, there can be positively excluded the possibility of a short circuit because the metal wire 31 is prevented from contacting the semiconductor chip 3.

Besides, since the tip end portion or the inner lead portion 22 of the second connecting lead 21 extends above the horizontal portion 13 of the die pad suspending lead 11 to a position located close to the center or longitudinal axis M of the semiconductor chip 3, a distance Q between the inner lead portion 22 and the electrode 32 can be made shorter, which allows the metal wire 31 to have a length satisfying the standards to be used for the bonding of the inner lead portion 22 to the electrode 32.

Figure 4:
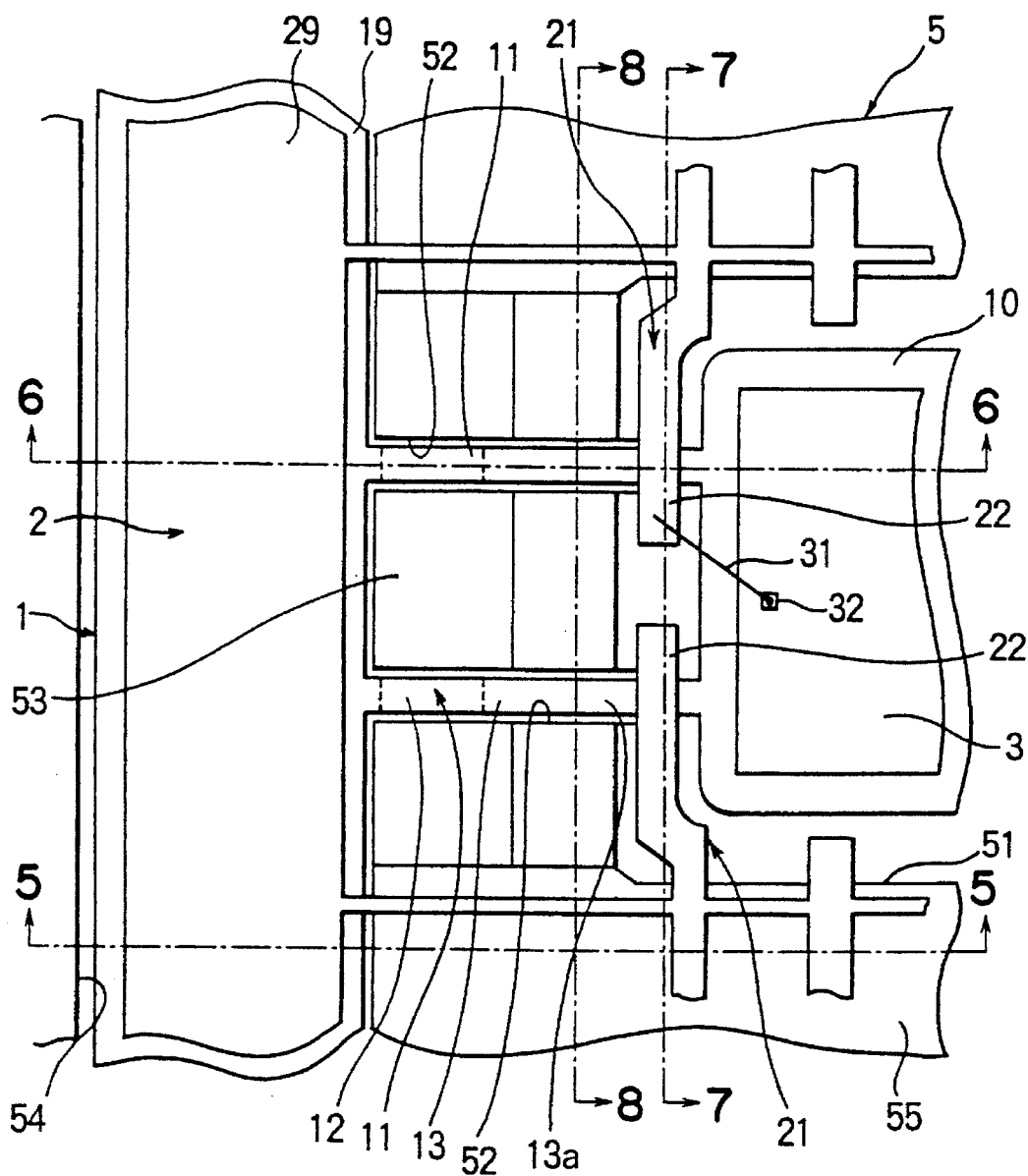
FIG. 4 shows, in a top plan view, a first lead frame and a second lead frame disposed within a molding cavity.

Next, the frame positioning step is effected as the second step. FIG. 4 shows in a top plan view the first lead frame 1 and the second lead frame 2 disposed within a molding die, FIG. 5 is a sectional view taken along a line 5—5 in FIG. 4 and viewed in the direction indicated by arrows, FIG. 6 is a sectional view taken along a line 6—6 in FIG. 4 and viewed in the direction indicated by arrow, FIG. 7 is a sectional view taken along a line 7—7 and viewed in the direction indicated by arrows, and FIG. 8 is a sectional view taken along a line 8—8 in FIG. 4 and viewed in the direction indicated by arrows.

Now, a description will be made of a molding die apparatus used in carrying out the semiconductor device manufacturing method according to the instant embodiment of the present invention.

Referring to FIGS. 4 to 8, the die apparatus as used is comprised of a lower molding die as a first molding die on which the first lead frame 1 and the second lead frame 2 are disposed and an upper molding die 6 which snugly fits onto the lower molding die 5.

Figure 5:
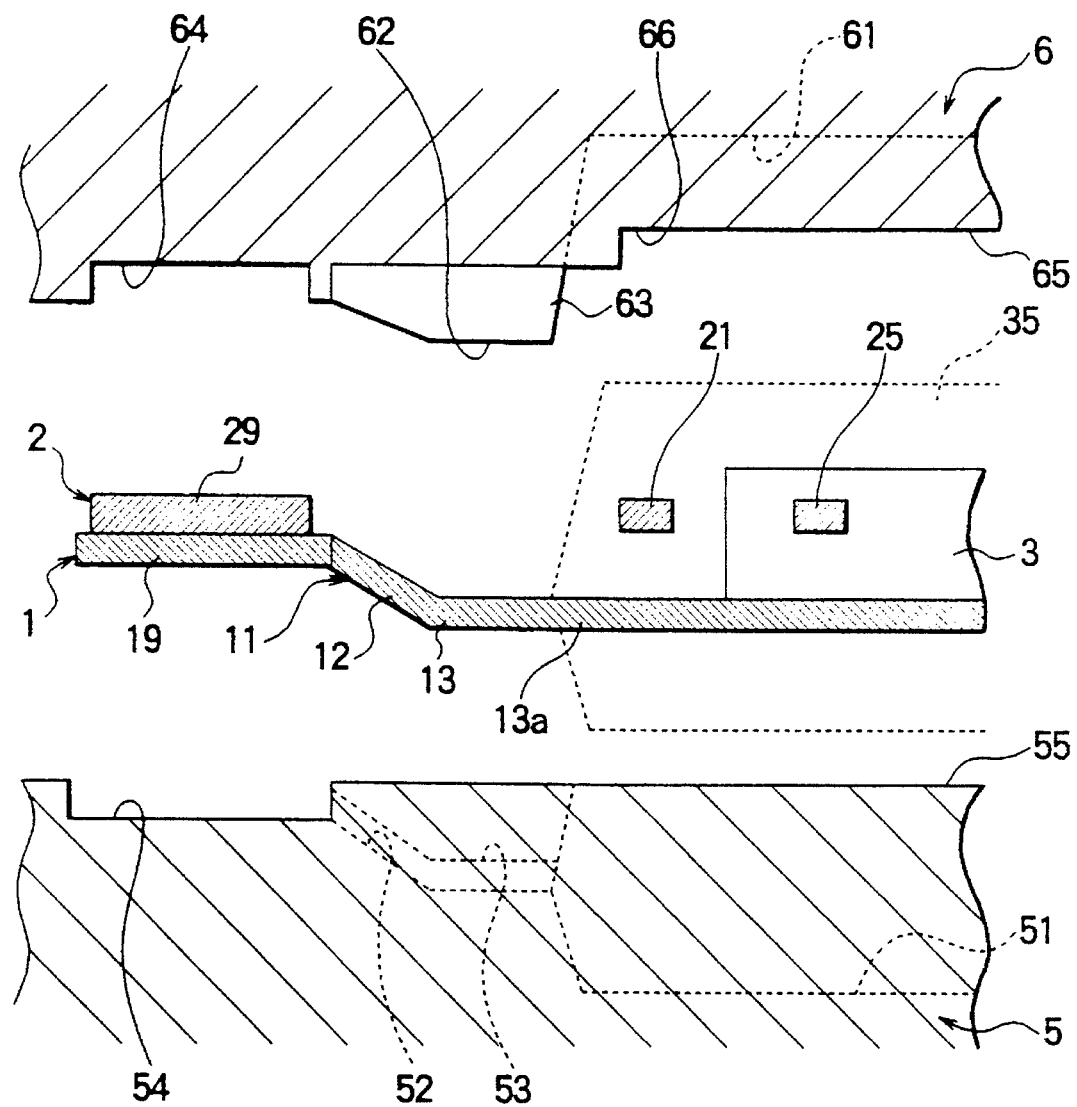
FIG. 5 is a sectional view taken along a line 5—5 in FIG. 4 and viewed in the direction indicated by affixed arrows.
Figure 6:
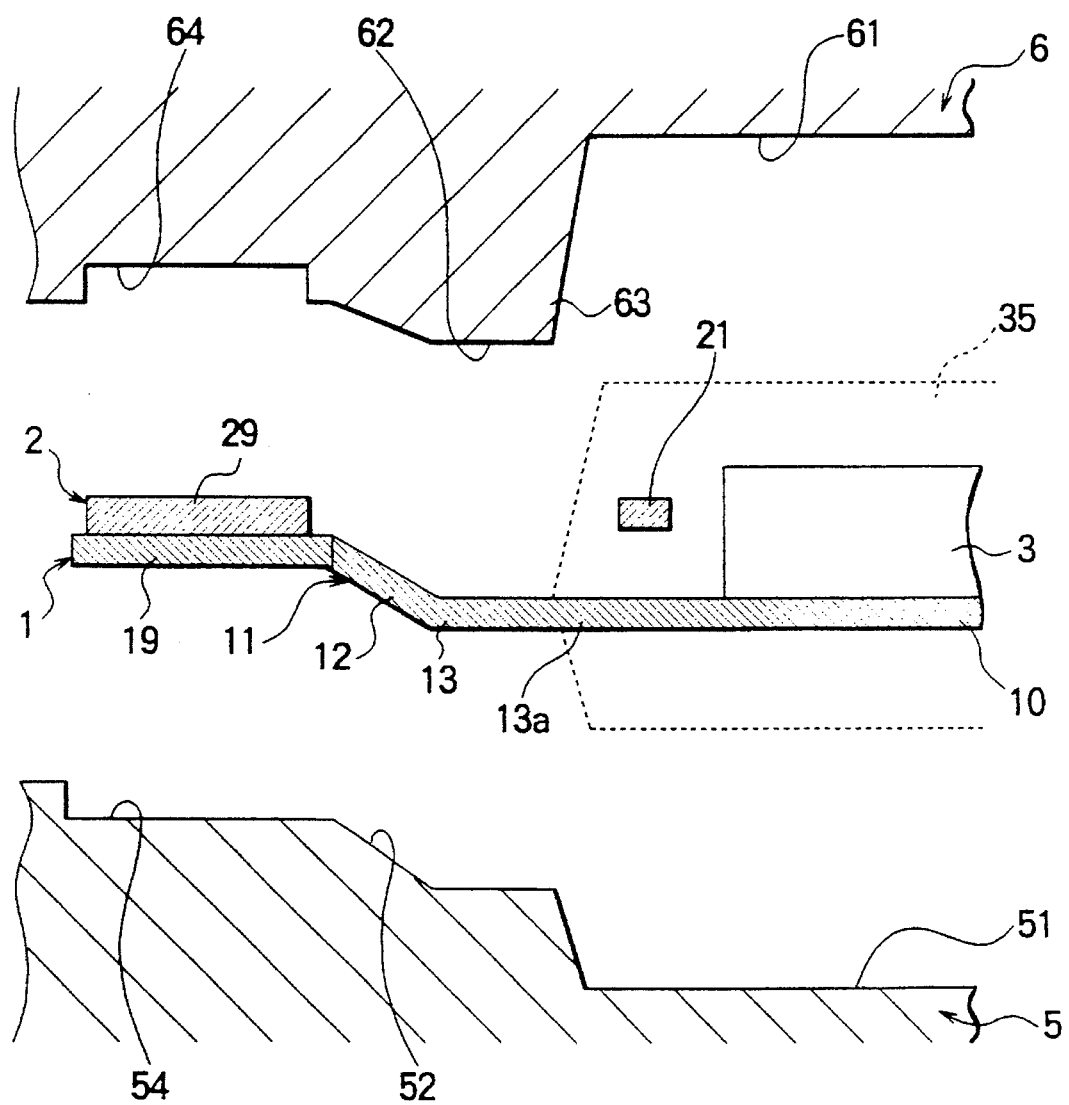
FIG. 6 is a sectional view taken along a line 6—6 in FIG. 4 and viewed in the direction indicated by affixed arrow.
Figure 7:
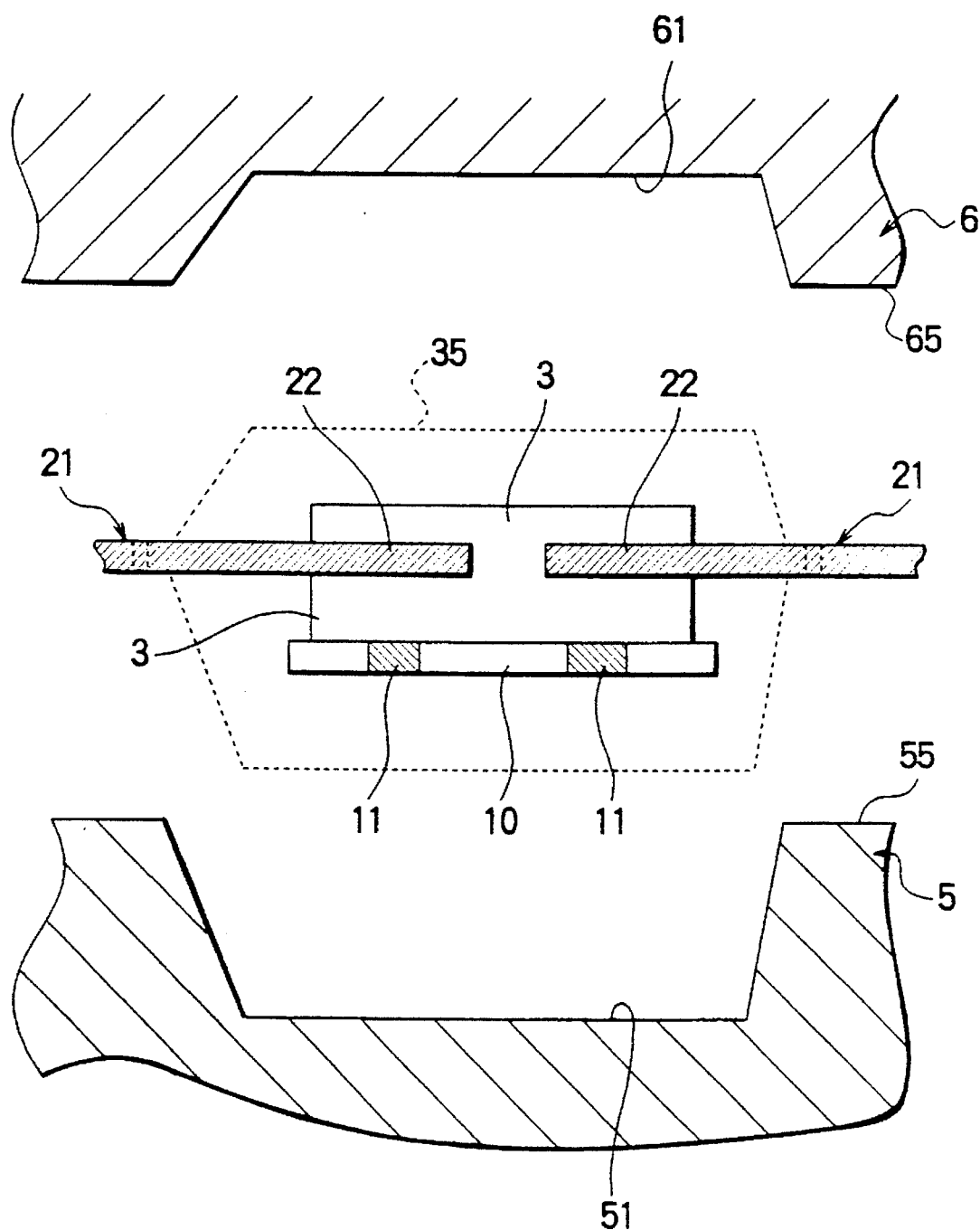
FIG. 7 is a sectional view taken along a line 7—7 in FIG. 4 and viewed in the direction indicated by affixed arrows.
Figure 8:
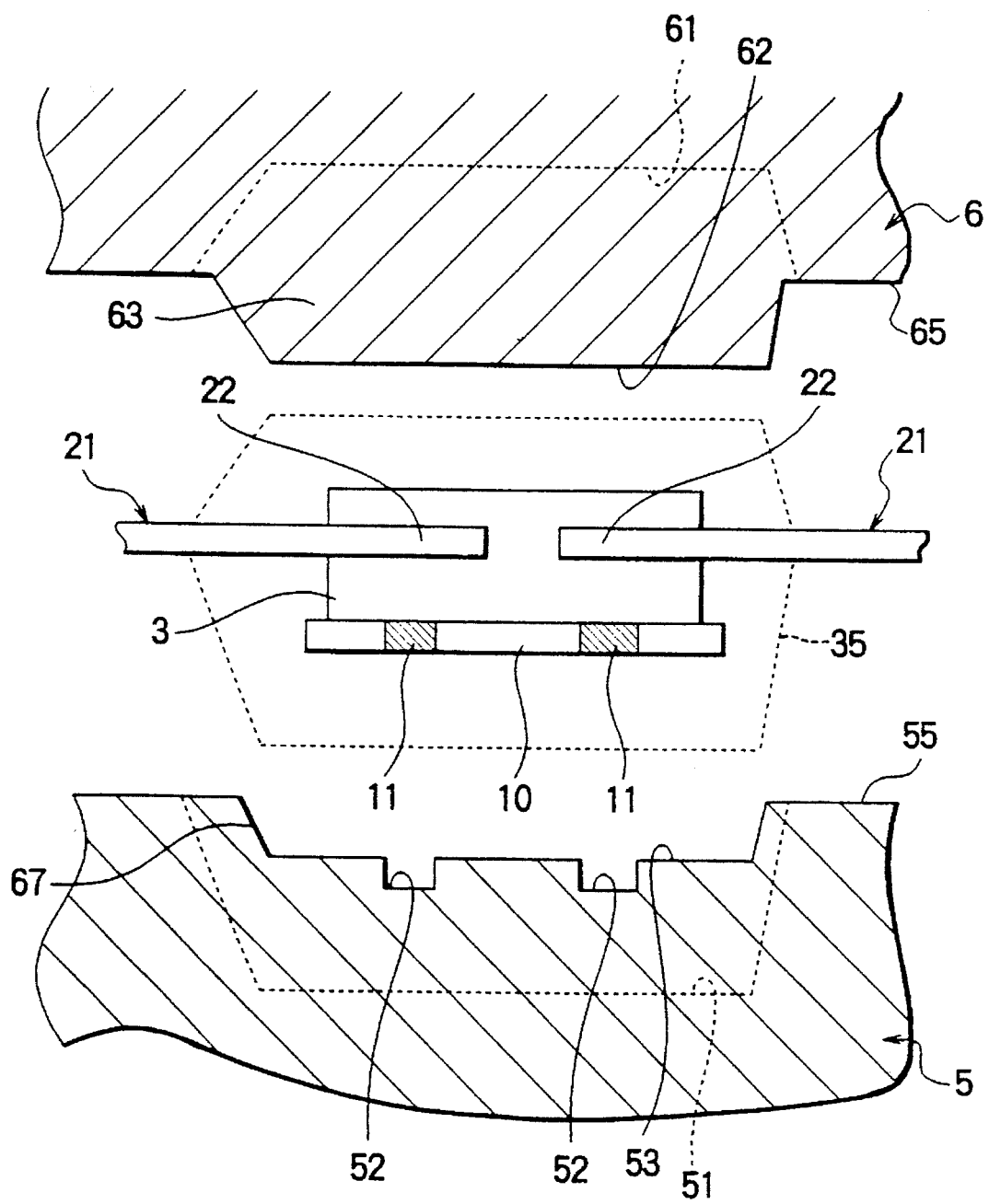
FIG. 8 is a sectional view taken along a line 8—8 in FIG. 4 and viewed in the direction indicated by affixed arrows.

Formed in the lower molding die 5 is a lower cavity 51 for defining an outer geometry or shape of a lower half of a package 35 (indicated in phantom in FIGS. 5 to 8). At each of the opposite sides (of which only the left side is shown in FIGS. 5 and 6) of the lower cavity 51, there is formed a positioning recess 53 having a pair of suspending lead receiving grooves 52 each so shaped as to accommodate therein the die pad suspending lead 11 of the first lead frame 1 including the offset portion 12 and the horizontal portion 13 connected in a flattened V-like shape in cross section. Formed in an end portion of the positioning recess 53 is a frame receiving recess 54 for receiving or accommodating therein the frame member 19 of the first lead frame 1. Further, reference numeral 55 denotes a lead parting surface which defines the outer periphery of the lower cavity 51.

On the other hand, the upper molding die 6 includes an upper cavity 61 in a position corresponding to the lower cavity 51 of the lower molding die 5 for defining the outer geometry or shape of an upper half portion of the package 35 to be formed. The lower cavity 51 and the upper cavity 61 cooperate to define a molding chamber which is filled with a molten resin material. Formed at each of the opposite sides of the upper cavity 61 is a positioning protrusion 63 which is formed in a shape corresponding to that of the positioning recess 53 and which is snugly fitted into the positioning recess 53 for confining the die pad suspending lead 11 in the suspending lead receiving grooves 52. A frame receiving recess 64 for accommodating therein the frame member 29 of the second lead frame 2 is formed adjacent to an outer end portion of the positioning protrusion 63.

Thus, a die pad parting surface 62 is formed in the bottom surface of the positioning protrusion 63 to serve as an abutting surface, while a lead parting surface 65 is formed in the outer periphery of the upper cavity 61 in correspondence to the lead parting surface 55 of the lower molding die 5. Further, a lead engaging groove 66 for engaging the second connecting lead(s) 21 and the first connecting lead(s) 25 is formed in the lead parting surface 65. In FIG. 8, reference numeral 67 denotes a parting line between the die pad parting surface 62 and the lead parting surface 65. The lower molding die 5 and the upper molding die 6 are designed to engage with each other along the parting line 67.

In the frame positioning step, the first lead frame 1 and the second lead frame 2 superposed on each other are disposed on the lower molding die 5, whereupon the upper molding die 6 is overlaid on the lower molding die 5. More specifically, the underlying first lead frame 1 is disposed on the lower molding die 5. Subsequently, the die pad 10 having the semiconductor chip 3 mounted thereon and having undergone the wire bonding process described above is disposed within the lower cavity 51 of the lower molding die 5, while the frame member 19 is lodged in the frame receiving recess 54 in the state where the die pad suspending leads 11 are accommodated within the suspending lead receiving grooves 52.

In this manner, the die pad 10, a base portion 13a of the horizontal portion(s) 13 of the die pad suspending lead(s) 11, the inner leads 22 of the second connecting leads 21 and the inner end portions of the first connecting leads 25 are disposed within the lower cavity 51.

In this state, the upper molding die 6 is moved downwardly until it abuts against the lower molding die 5, whereupon the lower molding die 5 and the upper molding die 6 are clamped together. To be more specific, the frame member 29 of the second lead frame 2 is fitted into the frame receiving recess 64 of the upper molding die 6 with the positioning protrusion 63 being fitted into the recess 53 of the lower molding die 5, while the second connecting leads 21 and the first connecting leads 25 are accommodated within the lead engaging recess 66, so that the lead parting surfaces 55 and 65, the parting line 67 as well as the die pad parting surface 62 and the top surface of the positioning recess 53, respectively, are brought into intimate contact with each other.

Thus, the die pad 10, the base portions 13a of the die pad suspending leads 11, the inner leads 22 of the second connecting leads 21 and the inner leads 26 of the first connecting leads 25 are disposed within the resin molding chamber defined by the lower and upper cavities 51 and 61, while the die pad suspending leads 11 are fixedly held by the positioning protrusion 63 confined within the suspending lead receiving grooves 52. In other words, a major portion of the offset portions 12 and the horizontal portions 13 of the paired die pad suspending leads 11 are fixedly held or supported by the positioning protrusion 63.

Next, description will turn to the forming or molding process.

After clamping the lower molding die 5 and the upper molding die 6 in the frame positioning step described above, a molten sealing resin material is charged into the resin chamber defined by the lower and upper cavities 51 and 61 and hardened or set.

In this case, the offset portions 12 of the die pad suspending leads 11 supporting the die pad 10 having the semiconductor chip 3 mounted thereon are disposed outside of the resin filled chamber defined by the lower and upper cavities 51 and 61. More specifically, because the offset portions 12 are restrained by the positioning protrusion 63 of the upper molding die 6 in the state confined within the suspending lead receiving grooves 52 of the lower molding die 5 with the die pad 10 being rigidly supported by the base portion 13a whose strength being maintained intact, the die pad 10 will not be displaced upwardly or downwardly even when non-uniform pressure is applied to the die pad 10 upon filling or charging of the cavity with the molten resin. Besides, because the die pad 10 is supported by the base portions 13a of the paired die pad suspending leads 11, rotation of the die pad 10 can also be suppressed.

Figure 9:
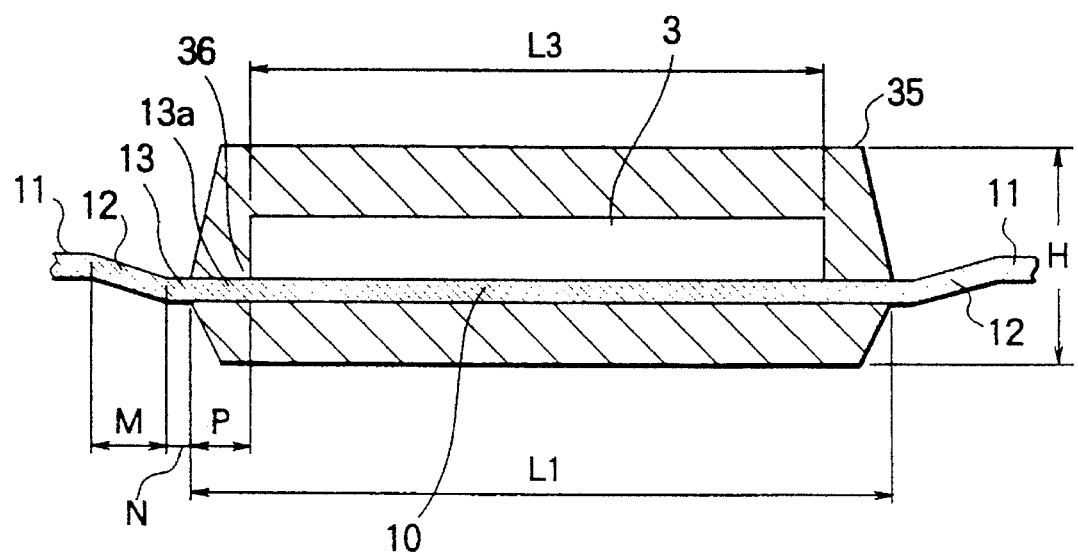
FIG. 9 is a sectional view showing a semiconductor device in an interim state after removal from the molding die.

Finally, the lead cutting process is carried out as the fourth step. FIG. 9 is a sectional view showing a semiconductor device in an interim state after removal from the molding die apparatus, FIG. 10 is a sectional view showing the same after the leads have been cut, and FIG. 11 is a perspective view showing the semiconductor device in a finished state.

After the resin has been set in the molding process described above, the upper molding die 6 is detached from the lower molding die 5, and an interim product of the semiconductor device having the package 35 molded as shown in FIG. 9 is taken out from the lower molding die. Subsequently, unnecessary exposed portions of the die pad suspending leads 11 of the first lead frame 1 extending outwardly from the package 35 are cut away together with the frame member 19 by using a press cutter, while the second connecting leads 21 and the first connecting leads 25 are cut off from the second connecting leads 21 of the second lead frame 2 with predetermined lengths of the second connecting leads 21 and the first connecting leads 25 being left. The semiconductor device is now in the finished state.

Figure 10:
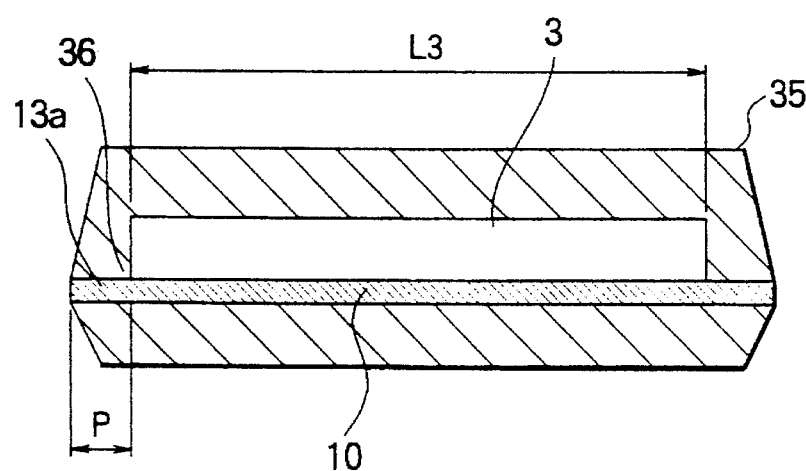
FIG. 10 is a sectional view showing the same after leads have been cut.
Figure 11:
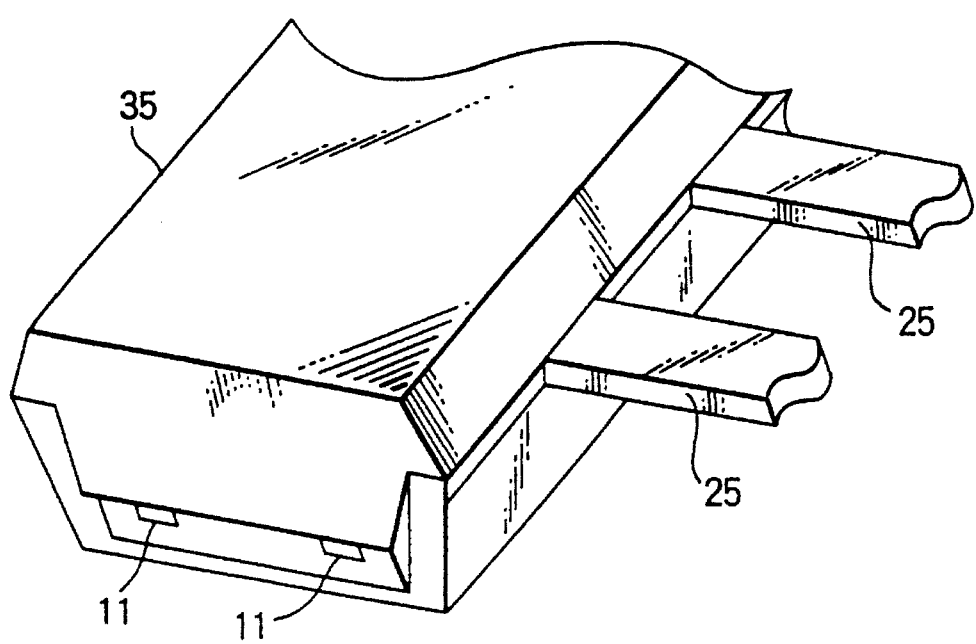
FIG. 11 is a perspective view showing the semiconductor device in a finished state.
Figure 17:
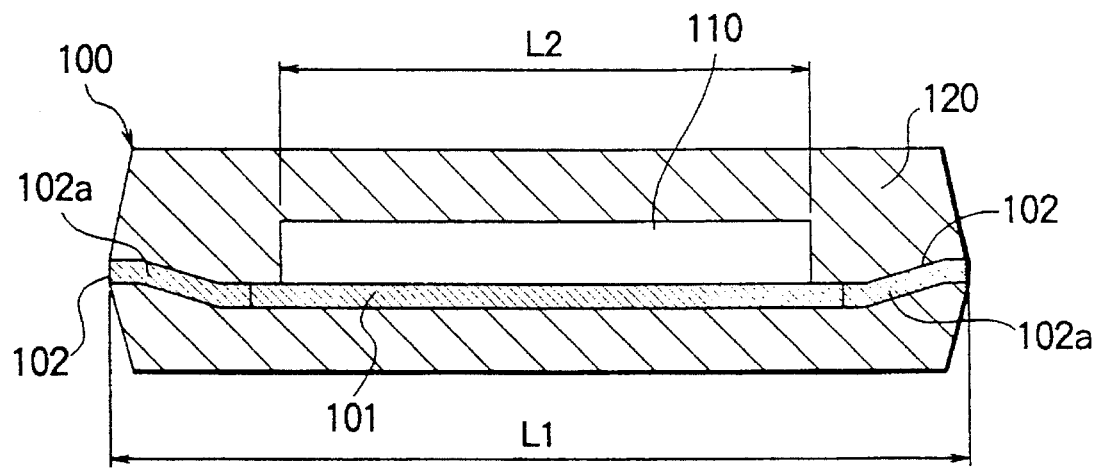
FIG. 17 is a sectional view of the same.
Figure 18:
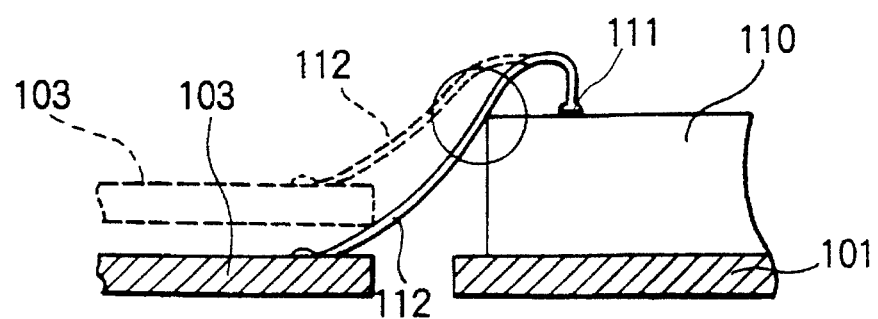
FIG. 18 is a front view for illustrating a wire bonding process.
Figure 19:
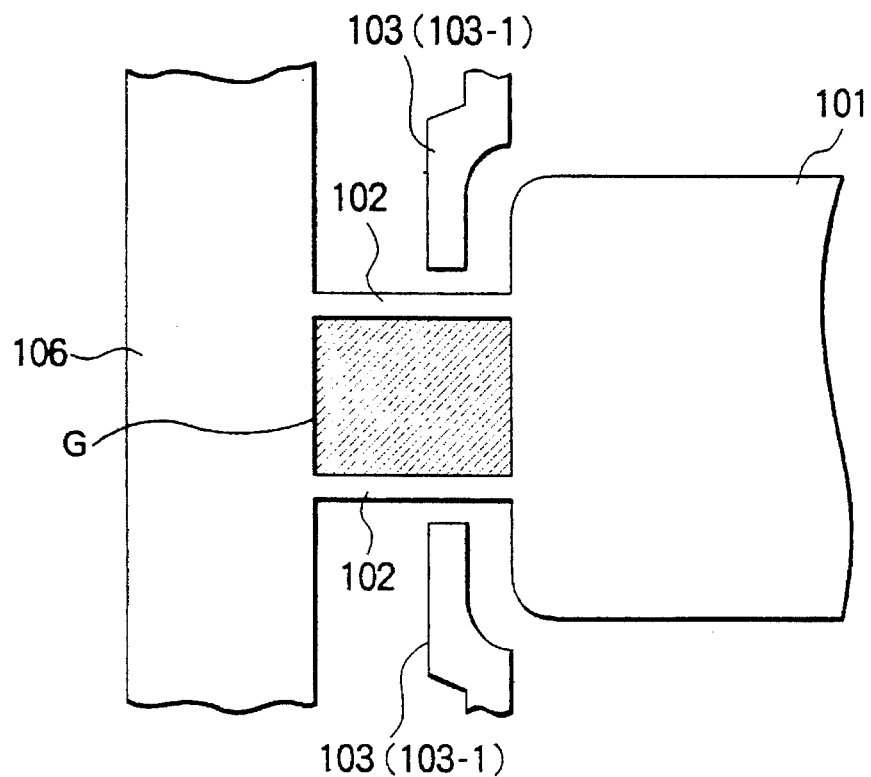
FIGS. 19 and 20 are a top plan view of a conventional lead frame provided with a pair of die pad suspending leads.
Figure 20:
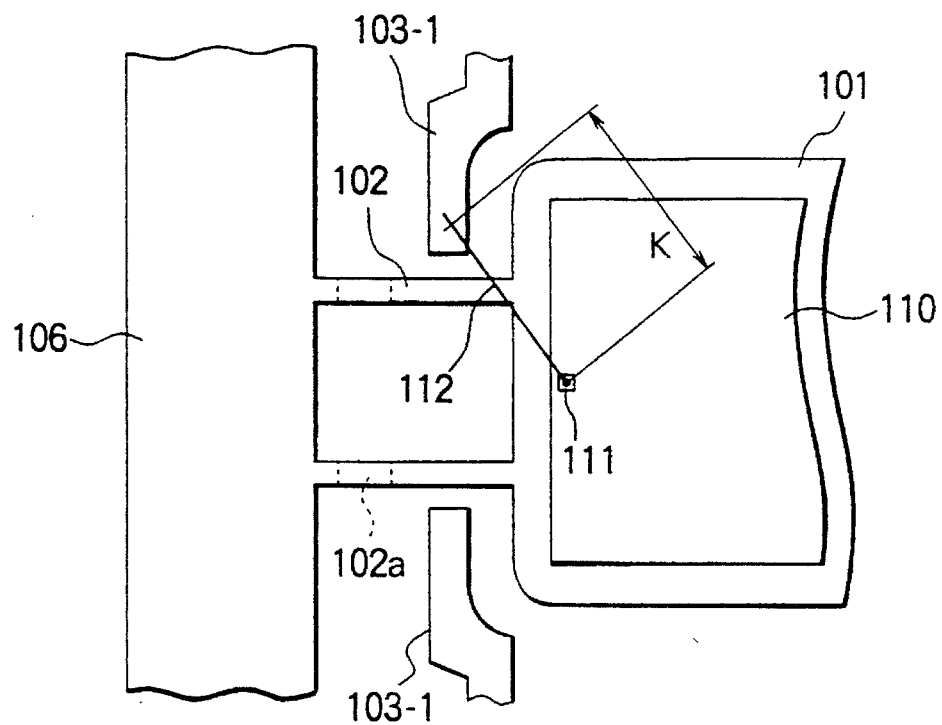

In the finished semiconductor device, wall portions 36 of the package 35 enclosing the semiconductor chip 3 are formed on the base portions 13a of the horizontal portions 13, as shown in FIGS. 9 and 10. Thus, the thickness of the wall portion 36 can be decreased. Accordingly, when compared with the semiconductor device known heretofore such as described in conjunction with FIG. 17, the outer dimension or size of the semiconductor chip 3 can be increased in proportion to reduction in the thickness of the wall portion 36, which in turn means that a semiconductor chip 3 of a large size can be mounted on the die pad 10.

By way of example, in the package 35 which is so standardized as to have an outer dimension L1 in a range of 10.79 to 41.27 mm and a thickness of 2.6 to 3.1 mm, the length M required for forming the offset portion 12 falls within a range of 0.3 to 0.5 mm, while the length N of the horizontal portion 13 sandwiched between the upper and lower dies which is required for forming the offset portion 12 is 0.1 mm. Thus, in the case of the hitherto known semiconductor device shown in FIG. 17, the wall portion is 0.5 to 0.7 mm in thickness because the wall portion crosses the offset portion 102a and the horizontal portions at both sides thereof. By contrast, with the semiconductor device manufacturing method according to the instant embodiment of the present invention, the wall portion 36 is formed on the base portion 13a of the horizontal portion 13 of the die pad suspending lead 11. Thus, the thickness P of the wall portion 36 can lie within a range of 0.2 to 0.4 mm. After all, there can be packed or encapsulated a semiconductor chip 3 having an outer dimension L3 increased by $$0.2 \text{ to } 1.0 \text{ (mm)} = \{(0.5 \text{ to } 0.7) - (0.2 \text{ to } 0.4)\} \times 2$$

when compared with the conventional semiconductor chip 110.

Further, in the semiconductor device manufacturing die apparatus employed in carrying out the instant embodiment of the present invention, the parting lines 67 interconnecting the positioning recess 53, the die pad parting surface 62 and the lead parting surfaces 55 and 65 are provided on the lateral surfaces of the package which have neither the second connecting leads 21 nor the first connecting leads 25 extending from them. As shown in FIGS. 5 to 8, the lateral surfaces of the package 35 mentioned above can be tapered to facilitate the removal of the interim product of the semiconductor device after packaging with the resin from the lower molding dies 5 and 6.

Further, owing to the fitting of the upper molding die 6 into the positioning recess 53 having the parting line 67 mentioned above, the positioning of the lower molding die 5 and the upper molding die 6 can easily be realized with improved accuracy. By way of example, when compared with the die assembly in which each of the upper molding die 6 and the lower molding die 5 includes a plurality of sections and in which the positioning means for the upper and lower molding dies 6 and 5 are formed at locations remote from the cavity, the positioning accuracy can be increased by about 10 μm.

Embodiment 2

Next, a second embodiment of the present invention will be described by reference to FIGS. 12 and 13. The semiconductor device manufacturing method according to the second embodiment is same as that of the first embodiment in including the die pad stamping/wire bonding process as the first step, the frame positioning process as the second step, the molding process as the third step and the leading cutting process as the fourth step. However, the structure of the frame formed by the die pad stamping/wire bonding process differs from that formed by the method according to the first embodiment.

Figure 12:
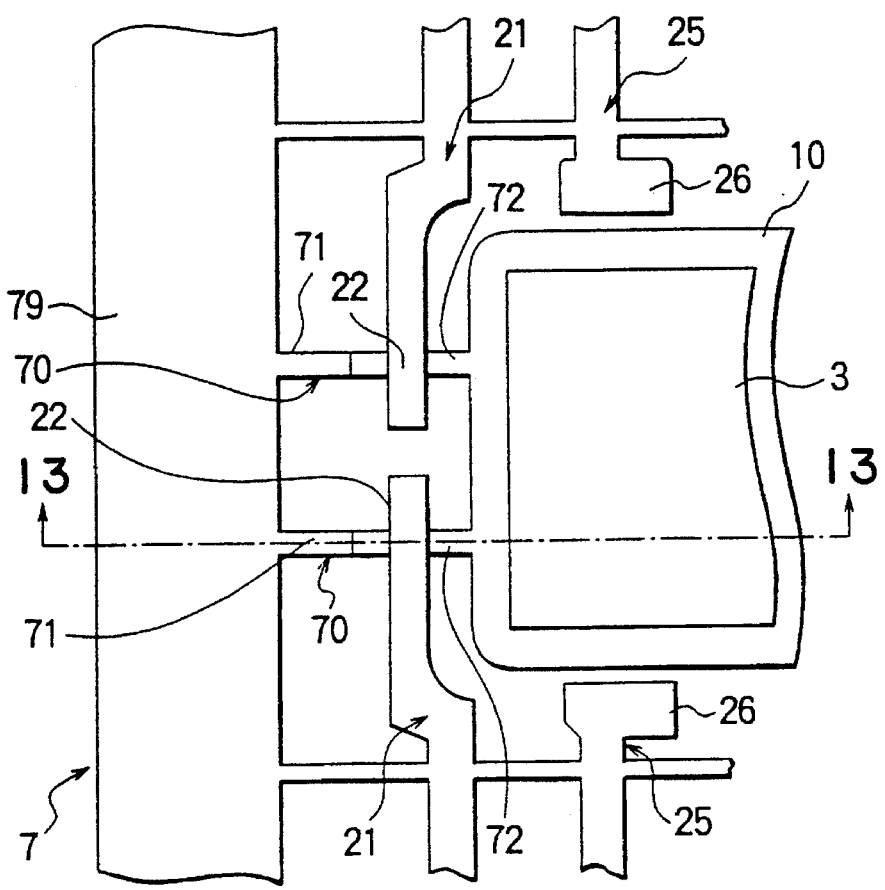
FIG. 12 is a top plan view for illustrating a semiconductor device manufacturing method according to a second embodiment of the present invention.
Figure 13:
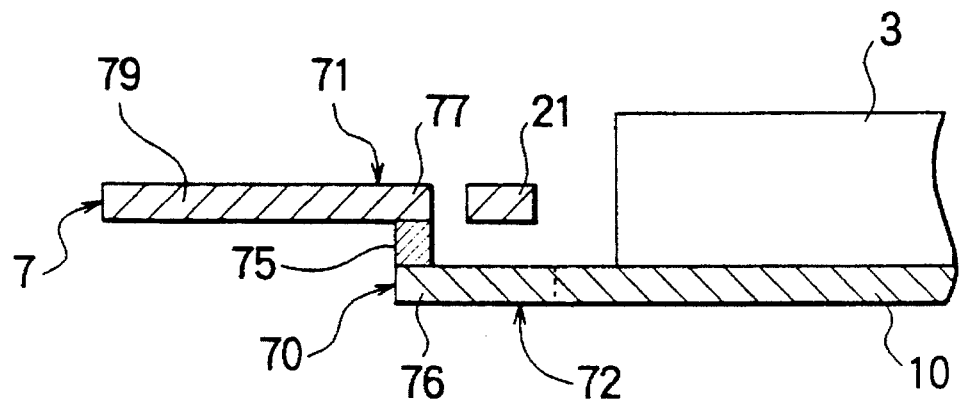
FIG. 13 is a sectional view taken along a line 13—13 in FIG. 12 and viewed in the direction indicated by affixed arrows.

FIG. 12 is a top plan view for illustrating a semiconductor device manufacturing method according to the second embodiment of the present invention, and FIG. 13 is a sectional view taken along a line 13—13 in FIG. 12 and viewed in the direction indicated by arrows. In these figures, like parts as those of the first embodiment are denoted by like reference characters for convenience of explanation.

Referring to FIGS. 12 and 13, a reference numeral 7 denotes a lead frame having the second connecting leads 21 and the first connecting leads 25, wherein each of frame members 79 disposed at both sides of the die pad 10 includes a pair of upper projecting parts 71 (first projecting parts) extending horizontally transverse to the inner leads 22, respectively.

On the other hand, a pair of lower projecting pieces 72 (second projecting pieces) extend horizontally, respectively, from opposite sides of the die pad 10 having the semiconductor chip 3 mounted thereon in the direction toward the upper projecting pieces 71, respectively.

In the die pad lowering/wire bonding process of the semiconductor device manufacturing method according to the instant embodiment of the present invention, the lead frame 7 and the die pad 10 are interconnected by adhesive members 75 serving as the connecting members to form the die pad suspending leads 70.

More specifically, the die pad 10 is so positioned that the lower projecting pieces 72 thereof extend transversely below the second connecting leads 21 of the lead frame 7 so that tip or free end portions 76 thereof are positioned directly beneath tip or free end portions 77 of the upper projecting pieces 71, respectively. Thereafter, the free end portions 77 and 76 of the upper and lower projecting pieces 71 and 72, respectively, are interconnected by the adhesive member 75 such as an adhesive tape, a bonding agent or the like, to thereby form the die pad suspending leads 70.

In the structure described above, the adhesive member 75 forms an offset portion which corresponds to the offset portion 12 in the semiconductor device according to the first embodiment, while the lower projecting piece 72 forms a horizontal portion corresponding to the horizontal portion 13 in the first embodiment. As a result, the second connecting lead 21 is positioned above spaced from, and crossing the lower projecting piece 72 with the die pad 10 being lowered relative to the second connecting lead 21.

In the semiconductor device manufacturing mold employed in the frame positioning process and the molding process according to the instant embodiment of the present invention, the positioning recess 53 in the lower molding die 5 corresponds to an L-like shape of the die pad suspending lead 70 formed by the upper projecting piece 71, the lower projecting piece 72 and the adhesive member 75, while the suspending lead receiving groove 52 corresponds to the shape of the die pad suspending lead 70. Further, the positioning protrusion 63 projecting from the upper molding die 6 conforms with the shape of the positioning recess 53.

Thus, through the molding process, the package 35 in which the adhesive members 75 are exposed exteriorly is formed integrally according to the instant embodiment, wherein the step for superposing at a predetermined position the first lead frame 1 having the die pad suspending leads 11 and the second lead frame 2 having the second connecting leads 21 and the first connecting leads 25 which are previously formed separately can be avoided, whereby the process for positioning the lead frame in the mold can be facilitated with work efficiency being correspondingly enhanced.

In other respects, the instant embodiment is essentially same as the first embodiment. Accordingly, any further description is unnecessary.

Embodiment 3

Next, a semiconductor device manufacturing method according to a third embodiment of the present invention will be described by reference to FIG. 14. The third embodiment differs from the second embodiment in that a spacer is employed as the connecting member.

Figure 14:
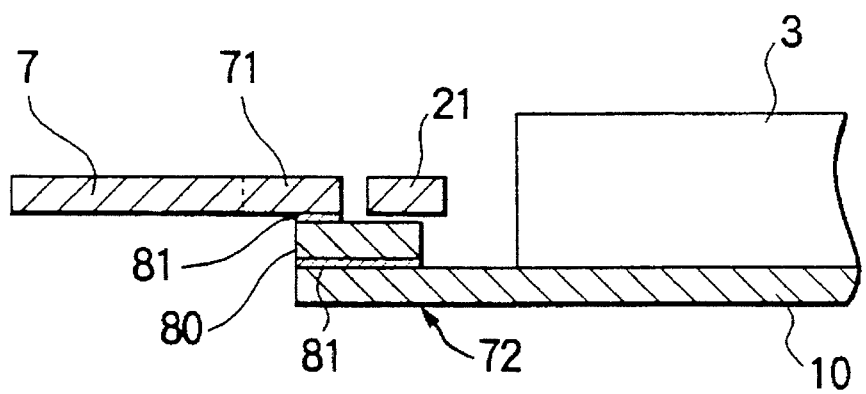
FIG. 14 is a sectional view similar to FIG. 13 for illustrating a semiconductor device manufacturing method according to a third embodiment of the present invention.

FIG. 14 is a sectional view similar to FIG. 13 for illustrating the semiconductor device manufacturing method according to the third embodiment of the present invention. Incidentally, it should be mentioned that in FIG. 14, like parts as those of the third and second embodiments are denoted by like reference characters for convenience of explanation.

In the case of the second embodiment, the tip or free end portions 77 and 76 of the upper and lower projecting pieces 71 and 72, respectively, are mutually connected by using the adhesive member 75 which cannot have an arbitrarily large thickness. As a consequence, the second connecting lead 21 and the lower projecting piece 72 are positioned close to each other in the exposed state, which may possibly incur unwanted contact between the second connecting lead 21 and the lower projecting piece 72 upon injection of the molten resin in the molding process, providing a cause for a short-circuit defect.

Such being the circumstances, it is proposed according to the invention in the third embodiment that a non-adhesive spacer 80 of an insulation material having a relatively large thickness is disposed beneath the upper projecting piece 71 and the second connecting lead 21, wherein the insulation spacer 80 is bonded to the upper projecting piece 71 and the lower projecting piece 72 by using an adhesive 81. By virtue of this structure, the tendency of the second connecting lead 21 to move downwardly upon injection of the molten resin can be suppressed by the insulation spacer 80 to thereby prevent positively the second connecting lead 21 and the lower projecting piece 72 from contacting with each other.

In other respects, the third embodiment are essentially same as the first and second embodiments. Accordingly, any further description is unnecessary.

Embodiment 4

A semiconductor device manufacturing method according to a fourth embodiment of the present invention differs from the second and third embodiments described above in that a projection is employed as the connecting member.

Figure 15:
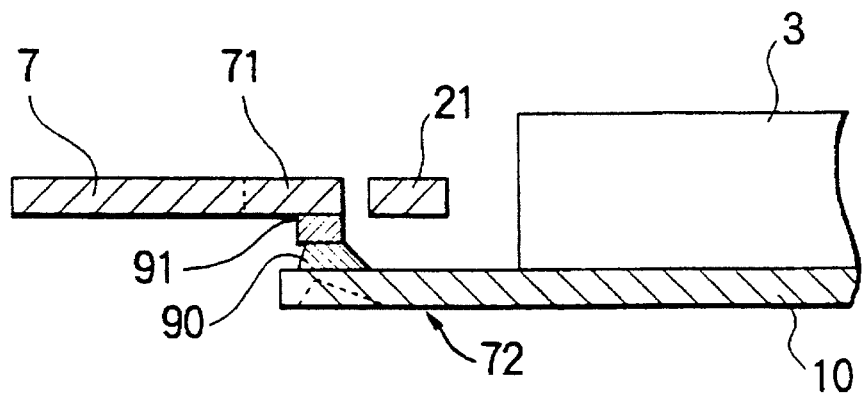
FIG. 15 is a sectional view similar to FIG. 14 for illustrating a semiconductor device manufacturing method according to a fourth embodiment of the invention.
Figure 16:
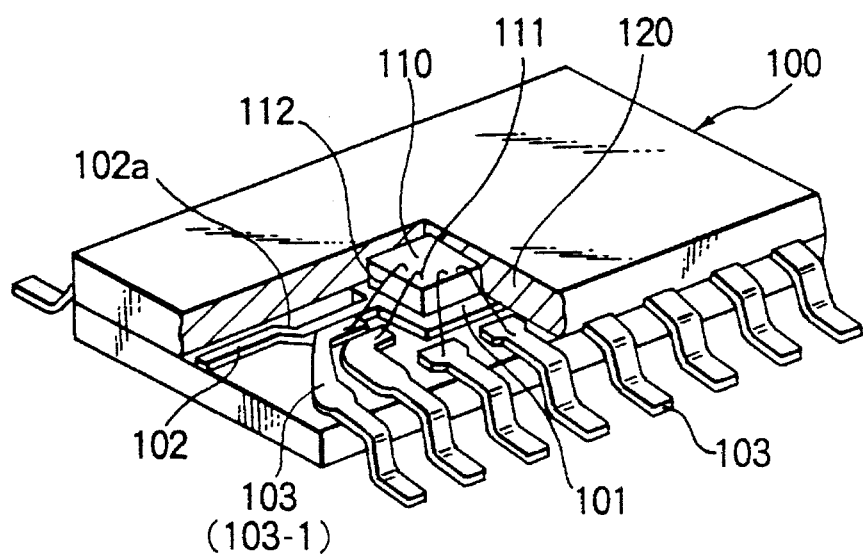
FIG. 16 is a perspective view showing a known semiconductor device with a portion broken away.

FIG. 15 is a sectional view similar to FIG. 14 for illustrating the semiconductor device manufacturing method according to the fourth embodiment of the invention. Incidentally, in FIG. 14, like parts as those of the first to third embodiments are denoted by like reference characters for convenience of explanation.

Referring to FIG. 15, a projection 90 at the tip or free end portion 76 of the lower projecting piece 72 projects downwardly toward the tip end portion 77 of the upper projecting piece 71, wherein a top end portion of the projection 90 is bonded to the upper projecting piece 71 by an adhesive 91. With this structure, a sufficiently large gap corresponding to a sum of the projecting height of the projection 90 and the thickness of the adhesive 91 can be secured between the second connecting lead 21 and the lower projecting piece 72, whereby the second connecting lead 21 can be positively prevented from contacting the lower projecting piece 72 notwithstanding the tendency of the second connecting lead 21 to move downwardly upon charging of the molten resin.

In other respects, the instant embodiment is essentially same as the first to third embodiments described hereinbefore.

Many features and advantages of the present invention are apparent from the detailed description and thus it is intended by the appended claims to cover all such features and advantages of the system which fall within the true spirit and scope of the invention. Further, since numerous modifications and combinations will readily occur to those skilled in the art, it is not intended to limit the invention to the exact structures and operations illustrated and described.

By way of example, although a pair of die pad suspending leads 11 are provided at each of the opposite sides of the die pad 10 by using the first lead frame 1 and the second lead frame 2, it is equally possible to implement the first lead frame 1 and the second lead frame 2 with a single lead frame with one die pad suspending lead 11 being provided at each of the opposite sides of the die pad 10, wherein the second connecting lead 21 extends to a position close to the die pad suspending lead 11. In this case, the lower molding die 5 having the positioning recess 53 including one lead receiving groove 52 is employed as the semiconductor device manufacturing die for holding the die pad suspending lead 11.

Accordingly, all suitable modifications and equivalents may be resorted to, falling within the spirit and scope of the invention.

What is claimed is:

1. A method of manufacturing a semiconductor device comprising:

a first step of disposing in superposition (i) a first lead frame including a die pad having a semiconductor chip mounted thereon, the die pad being supported by a plurality of die pad suspending leads each having an offset portion, and (ii) a second lead frame having connecting leads extending close to electrodes of said semiconductor chip, and electrically connecting respective inner lead portions of said connecting leads to corresponding electrodes of said semiconductor chip with metal wires;

a second step of disposing said first and second lead frames on a first molding die such that said die pad and said inner lead portions are disposed within a first cavity in said first molding die while said offset portions of said die pad suspending leads are disposed outside of said first cavity and overlaying a second molding die having a second cavity on said first molding die to define a resin molding chamber, part of said first and second lead frames inclusive of said offset portions being clamped between abutting surfaces of said first and second molding dies;

a third step of forming a package by filling the resin molding chamber with a resin; and a fourth step of removing said package from said first and second molding dies, cutting off said offset portions exposed outside said package, and cutting said connected leads to a predetermined length.

2. The method of manufacturing a semiconductor device according to claim 1 wherein in said first step, said die pad suspending leads are pressed down to form said offset portions, said semiconductor chip is mounted on said die pad, and electrical connections are made between the electrodes of said semiconductor chip and the inner lead portions of said connection leads by bonding the metal wires.

3. The method of manufacturing a semiconductor device according to claim 1 wherein in said first step, said first lead frame includes a plurality of first projections that are part of said die pad suspending leads, the connecting leads each extending transverse to a tip end of said first projections, and a plurality of second projections extending from said die pad; and wherein, after disposing said die pad such that each of said second projections is spaced from said connecting leads, connecting respective first and second projections with connecting members to form said plurality of die pad suspending leads.

4. The method of manufacturing a semiconductor device according to claim 3 wherein said connecting member is an adhesive material.

5. The method of manufacturing a semiconductor device according to claim 3 wherein said connecting members include a spacer disposed opposite said first projections, said connecting leads extending transversely to said first projections, and bonded to one of said first projections and one of said second projections sandwiched between said first and second projections.

6. The method of manufacturing a semiconductor device according to claim 3 wherein said connecting member includes a projection on one of said first and second projections and bonded to the other of said first and second projections.

7. The method of manufacturing a semiconductor device according to claim 2 including, in said first step, making electrical connections between the electrodes of said semiconductor chip and said connecting leads by bonding said metal wires while end portions of said connecting leads are supported on supporting platforms protruding between and beyond adjacent die pad suspending leads.

8. The method of manufacturing a semiconductor device according to claim 3 including, in said first step, making electrical connections between the electrodes of said semiconductor chip and said connecting leads by bonding said metal wires while end portions of said connecting leads are supported on supporting platforms protruding between and beyond adjacent die pad suspending leads.

9. A method of manufacturing a semiconductor device comprising:

a first step of forming a lead frame including a die pad, die pad suspending leads connected to said die pad and having an offset portion, and connecting leads extending close to said die pad, mounting a semiconductor chip of said die pad, and electrically connecting inner lead portions of said connecting leads to electrodes of said semiconductor chip with metal wires;

a second step of positioning said lead frame on a first molding die such that said die pad and said inner lead portions of said connecting leads are disposed within a first cavity in said first molding die while said offset portions of said die pad suspending leads are disposed outside of the first cavity and overlaying a second molding die having a second cavity on said first molding die to define a resin molding chamber with part of said lead frame, inclusive of said offset portions, being clamped between abutting surfaces of said first and second molding dies;

a third step of forming a package by filling the resin molding chamber with a resin; and a fourth step of removing said package from said first and second molding dies, cutting off said offset portions exposed outside said package, and cutting said connected leads to a predetermined length.

10. The method of manufacturing a semiconductor device according to claim 9 wherein in said first step, said die pad suspending leads are pressed down to form said offset portions, said semiconductor chip is mounted on said die pad, and electrical connections are made between the electrodes of said semiconductor chip and the inner lead portions of said connection leads by bonding the metal wires.

11. The method of manufacturing a semiconductor device according to claim 9 wherein in said first step, said first lead frame includes a plurality of first projections that are part of said die pad suspending leads, the connecting leads each extending transverse to a tip end of said first projections, and a plurality of second projections extending from said die pad; and wherein, after disposing said die pad such that each of said second projections is spaced from said connecting leads connecting respective first and second projections with connecting members to form said plurality of die pad suspending leads.

12. The method of manufacturing a semiconductor device according to claim 11 wherein said connecting member is an adhesive material.

13. The method of manufacturing a semiconductor device according to claim 11 wherein said connecting members include a spacer disposed opposite said first projections, said connecting leads extending transversely to said first projections, and bonded to one of said first projections and one of said second projections sandwiched between said first and second projections.

14. The method of manufacturing a semiconductor device according to claim 11 wherein said connecting member includes a projection on one of said first and second projections and bonded to the other of said first and second projections.

15. The method of manufacturing a semiconductor device according to claim 10 including, in said first step, making electrical connections between the electrodes of said semiconductor chip and said connecting leads by bonding said metal wires while end portions of said connecting leads are supported on supporting platforms protruding between and beyond adjacent die pad suspending leads.

16. The method of manufacturing a semiconductor device according to claim 11 including, in said first step, making electrical connections between the electrodes of said semiconductor chip and said connecting leads by bonding said metal wires while end portions of said connecting leads are supported on supporting platforms protruding between and beyond adjacent die pad suspending leads.

* * * * *